United States Patent [19]

Cosand et al.

[11] 4,370,572
[45] Jan. 25, 1983

[54] DIFFERENTIAL SAMPLE-AND-HOLD CIRCUIT

[75] Inventors: Albert E. Cosand, Agoura; Kenneth B. de Graaf, Rancho Palos Verdes, both of Calif.

[73] Assignee: TRW Inc., Redondo Beach, Calif.

[21] Appl. No.: 112,963

[22] Filed: Jan. 17, 1980

[51] Int. Cl.³ .............................................. G11C 27/02
[52] U.S. Cl. .................................... 307/353; 328/151
[58] Field of Search ................. 307/352, 353; 328/151

[56] References Cited

U.S. PATENT DOCUMENTS 3,671,783  6/1972  Hampel et al. ....................... 307/353
3,696,305 10/1972  Mitchell et al. ................. 307/353 X
3,851,260 11/1974  Colin ............................. 307/353 X

*Primary Examiner*—John Zazworsky
*Attorney, Agent, or Firm*—Donald R. Nyhagen

[57] ABSTRACT

A high-speed sample-and-hold circuit well suited for fabrication in monolithic form, the circuit including a pair of capacitors used to track a differential analog signal, and at least two switches for connecting the analog signal to the capacitors in a tracking mode, and for isolating the capacitors from the analog signal in a hold mode. In a preferred embodiment of the invention, the switches are diodes and each capacitor is driven differentially through a separate pair of diodes, which are forward-biased in the tracking mode and reverse-biased in the hold mode. Additional circuitry is provided to compensate for variations in characteristics of the diodes due to temperature changes. Furthermore, the effects of capacitive coupling through the diodes in the hold mode are minimized by disconnecting the analog input signal and substituting a signal derived from the held signal stored in the capacitors.

8 Claims, 8 Drawing Figures

DIFFERENTIAL SAMPLE-AND-HOLD CIRCUIT

BACKGROUND OF THE INVENTION

This invention relates generally to sample-and-hold circuits, and, more particularly, to sample-and-hold circuits that lend themselves to fabrication in monolithic form.

Recent advancements in integrated circuit technology have produced high-speed analog-to-digital converters in monolithic form. However, there has been no accompanying development of a corresponding high-speed integrated sample-and-hold circuit to provide analog input signals to an analog-to-digital converter. A typical high-speed sample-and-hold circuit of the prior art comprises an input amplifier, a capacitor, a switch for connecting a signal from the input amplifier to the capacitor, and an output amplifier for amplifying an output signal derived from the capacitor. The switch is typically a field effect transistor (FET) or a diode bridge driven by a transformer, the latter, of course, being a circuit element that cannot be produced in monolithic form. When the switch is closed, the voltage across the capacitor varies in accordance with the input signal, and this mode of operation is usually referred to as the tracking mode. When the switch is open, the capacitor preserves a signal sample corresponding to the level of the input signal at the time the switch is opened, and the circuit is then in a hold mode.

There are a number of design problems that can lead to significant inaccuracies in the operation of sample-and-hold circuits in general. For example, the output amplifier may draw a significant input current from the capacitor, resulting in a voltage droop when the switch is in the open condition and the circuit is in the hold mode. Another problem that may introduce errors while in the hold mode is that energy used to actuate the switch may be coupled onto the capacitor. Yet another problem in the hold mode is that the input analog signal may be capacitively coupled through the switch to the capacitor. Typically, there are other inaccuracies as well, due to linearity errors in the switch and amplifiers, settling time errors attributable to reactive parasitic impedances in leads between the components, and offset errors in the amplifier and the switch.

Sample-and-hold circuits of the general type with which the invention is concerned are either of discrete-component and hybrid, or monolithic construction. Discrete-component and hybrid construction both require relatively costly fabrication and assembly processes, as compared with monolithic fabrication. In addition, discrete-component sample-and-hold circuits cannot, in general, achieve a desirable level of performance. Certain types of hybrid circuits, using thin-film fabrication processes, have minimized many of the problems that lead to inaccuracy of performance, and have achieved high speeds of operation, but their cost is close to two orders of magnitude higher than monolithic circuits for performing the same function.

Monolithic sample-and-hold circuits are currently available from a number of manufacturers, but without exception, such circuits have, prior to this invention, utilized single-ended circuitry, typically employing operational amplifiers. Although these single-ended monolithic circuits are much less costly than the hybrid circuits discussed above, they are two to three orders of magnitude slower than the hybrid circuits. Accordingly, there has been a clear need for a monolithic sample-and-hold circuit which is much faster than such circuits already available, and which combines the advantages of low cost, high speed, and accuracy. The present invention is directed to this end.

SUMMARY OF THE INVENTION

The present invention resides in a sample-and-hold circuit in which signals are processed differentially to minimize errors inherent in single-ended processing, and at the same time to obtain a very high speed of operation. The differential circuit of the invention is also well suited to fabrication as an integrated circuit, since the differential techniques employed make appropriate use of a high degree of device matching available in integrated circuits, and of the availability of a greater number of devices per circuit function, as compared with a corresponding discrete component or hybrid circuit.

Basically, and in general terms, the sample-and-hold circuit of the invention comprises input amplifier means providing a differential analog signal on a pair of analog signal lines, capacitor means, switching means for selectively coupling the analog signal lines to the capacitor means, and a differential output amplifier having inputs coupled to the capacitor means, and providing a sample analog output signal. More specifically, the capacitor means comprises a pair of capacitors, each connected between one of the input terminals of the differential amplifier and a common point, such as ground.

It will be apparent that, in such a configuration, errors due to input current drawn by the output amplifier will be cancelled in a properly balanced circuit, since such currents will tend to increase or decrease the charge on both of the capacitors. Similarly, any switching energy coupled onto one of the capacitors while in the hold mode will tend to be balanced out by coupling of energy onto the other of the capacitors.

In accordance with another aspect of the invention, errors due to capacitive coupling through the switching means are effectively eliminated by providing means for disconnecting the analog input signal during the hold mode, and substituting a value proportional to the signal held in the capacitors.

In accordance with a presently preferred embodiment of the invention, the sample-and-hold circuit comprises an input amplifier with differential analog outputs, two additional differential amplifiers to which the outputs of the input amplifier are coupled, and two separate switching means coupling the outputs of the additional differential amplifiers to the capacitors. The switching means include two pairs of switching diodes connected in signal lines from the additional differential amplifiers to the capacitors, a bias level applied to the diodes being controllable either to switch the analog signals through to the capacitors, or to isolate the capacitors from any input signal.

In one specific embodiment of the invention, the required analog voltage is developed across the capacitors by drawing an analog-signal-modulated current through resistors connected to the capacitors. In another embodiment, there is a constant bias current through the resistors in the tracking mode, and the analog signal is injected as a voltage applied to capacitors through the resistors and switching diodes.

In accordance with a further aspect of the invention, the circuit includes compensating means for maintaining a constant forward-bias current through the diodes in the tracking mode, regardless of the effects of temperature and signal voltage. More specifically, this compensating means includes an additional pair of diodes with the same current density as the two pairs of switching diodes.

Other aspects and advantages of the present invention will become apparent from the following more detailed description, taken in conjunction with the accompanying drawings.

DESCRIPTION OF THE PREFERRED EMBODIMENTS

Figure 1:
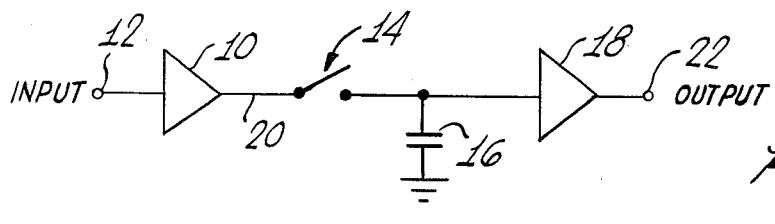
FIG. 1 is a simplified schematic diagram of a typical sample-and-hold circuit of the prior art.

As shown in the drawings for purposes of illustration, the present invention relates to sample-and-hold circuits capable of being fabricated in monolithic form. As shown in FIG. 1, a typical sample-and-hold circuit of the prior art comprises an input amplifier, indicated by reference numeral 10, to which an input signal, indicated at 12, is applied, a switch 14, a capacitor 16 and an output amplifier 18. The output of the input amplifier 10 is connected to one terminal the switch 14 over line 20, and the other terminal of the switch, which is of the single-pole-single-throw type, is connected to one terminal of the capacitor 16 and to one input terminal of the output amplifier 18. The other terminal of the capacitor 16 is grounded, and a sampled output is provided by the output amplifier 18, as indicated at 22. The switch 14 typically takes the form of a field effect transistor (FET) or a Schottky diode bridge driven by a transformer. Sample-and-hold circuits using discrete components or hybrid circuitry are very costly to manufacture. Although available monolithic circuits for the same purpose are much less costly, they suffer from a number of drawbacks, principally their slow speed of operation.

In accordance with the present invention, and as shown in the drawings, a monolithic sample-and-hold circuit is provided in which signals are processed in a completely differential manner, thereby combining the advantages of low cost of production and very high speed, and at the same time minimizing the inaccuracies that can result from a single-ended approach.

Figure 2:
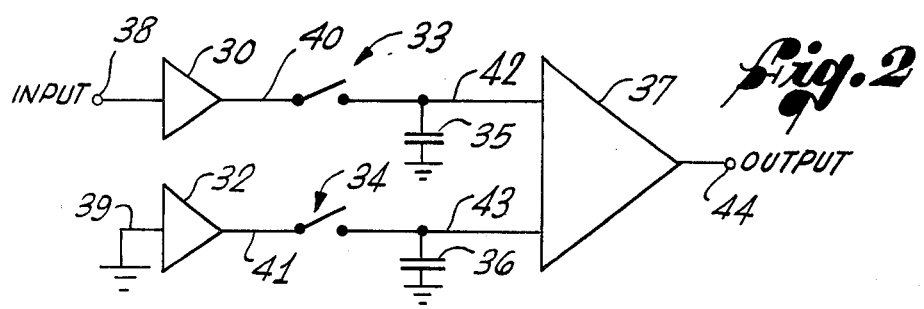
FIG. 2 is a simplified schematic diagram of a differential sample-and-hold circuit in accordance with the principles of the present invention.

As shown, for example, in FIG. 2, the circuit includes two identical input amplifiers 30 and 32, two switches 33 and 34, two capacitors 35 and 36 and a differential input amplifier 37. The analog input signal, indicated at 38, is applied as an input to input amplifier 30, while the input of corresponding amplifier 32 is grounded, as shown at 39. The outputs of the amplifiers 30 and 32, on lines 40 and 41, are connected to corresponding switches 33 and 34, and thence by lines 42 and 43 to the input terminals of the differential amplifier 37, and also to one terminal of each of the capacitors 35 and 36, which have their other terminals grounded. It will be apparent that, when the switches 33 and 34 are closed, placing the circuit in a tracking mode, the voltage developed across the two capacitors 35 and 36 is proportional to the input voltage applied to terminal 38. When the switches 33 and 34 are opened, in a hold mode, the voltage across the two capacitors 35 and 36 is amplified by the output amplifier 37, which preferably has a very high input impedance, and a sampled output is provided on line 44.

Figure 3:
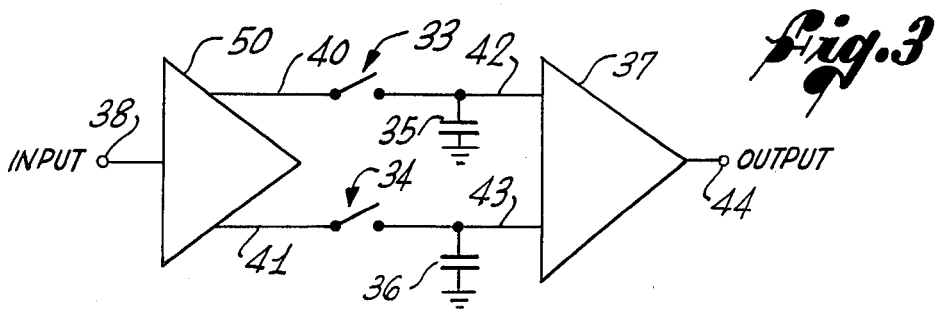
FIG. 3 is a simplified schematic diagram similar to FIG. 2, but utilizing a single input amplifier with differential outputs.

The configuration shown in FIG. 3 is similar to that shown in FIG. 2, except that, instead of the input amplifiers 30 and 32, a single amplifier 50 is provided, having a single-ended input to which the analog input signal is applied at 38, and differential outputs coupled to the switches 33 and 34 over lines 40 and 41.

Figure 4:
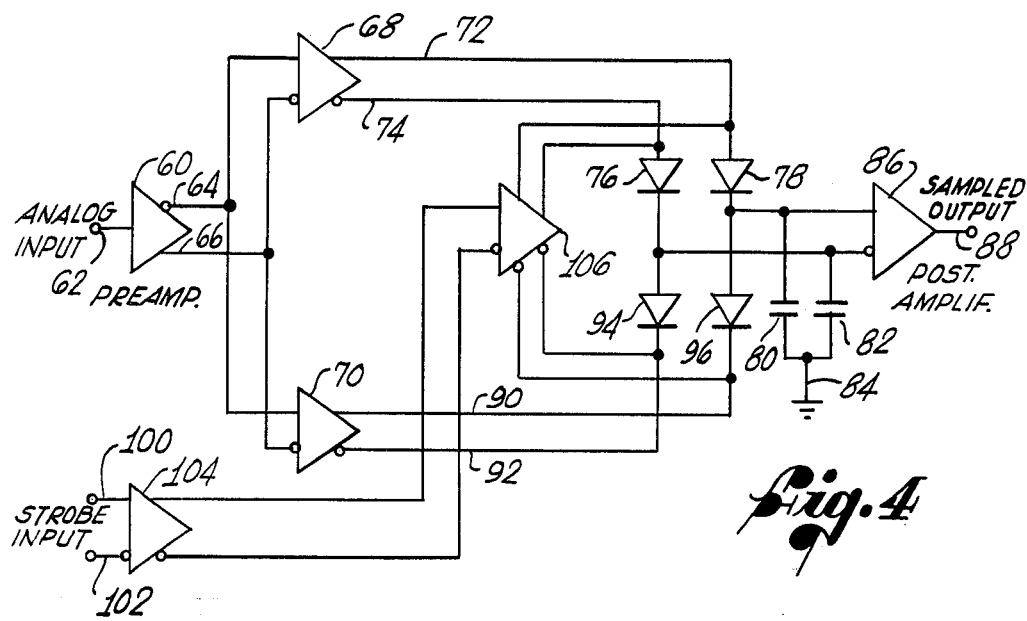
FIG. 4 is a simplified schematic diagram of another embodiment of the invention having dual differential analog circuits.

FIG. 4 shows in simplified form a presently preferred embodiment of the invention in which dual differential analog amplifiers are employed. Basically, the circuit comprises a preamplifier 60 having a single-ended analog input, indicated at 62, and having complementary outputs on lines 64 and 66, and two differential analog amplifiers 68 and 70 to which the signal lines 64 and 66 are connected as inputs. The outputs from amplifier 68, on lines 72 and 74, are connected to anode terminals of two diodes 76 and 78. The cathode terminals of the diodes are connected to first terminals of capacitors 80 and 82, the other terminals of which are grounded, as indicated at 84. The first terminals of the capacitors 80 and 82 are also connected as inputs to a post-amplifier 86, which provides a sampled output signal on line 88.

The output signals from the other differential analog amplifier 70, on lines 90 and 92, are coupled to the cathode terminals of two additional diodes 94 and 96, the anode terminals of which are connected to the cathodes of the diode 76 and 78, respectively, as well as to the capacitors 80 and 82 and to the input terminals of the post-amplifier 86. A strobe input signal, or, more specifically two complementary signals, are provided on lines 100 and 102 to an amplifier 104, the complementary outputs of which are applied to yet another amplifier 106. The outputs of the amplifier 106 are coupled to the signal lines 72, 74, 90 and 92, respectively, and it will be appreciated that this is intended to indicate that, on the occurrence of an appropriate strobe input signal on lines 100 and 102, the amplifier 106 generates switching signals which can appropriately bias the diodes 76, 78, 94 and 96 into the tracking mode, wherein the analog signals from amplifiers 68 and 70 are coupled through the dioes and thence to the capacitors 80 and 82. In the hold mode, the signals generated in the amplifier 106 are such as to reverse-bias the diodes, and to thereby isolate the capacitors 80 and 82 from incoming analog signals.

Figure 5:
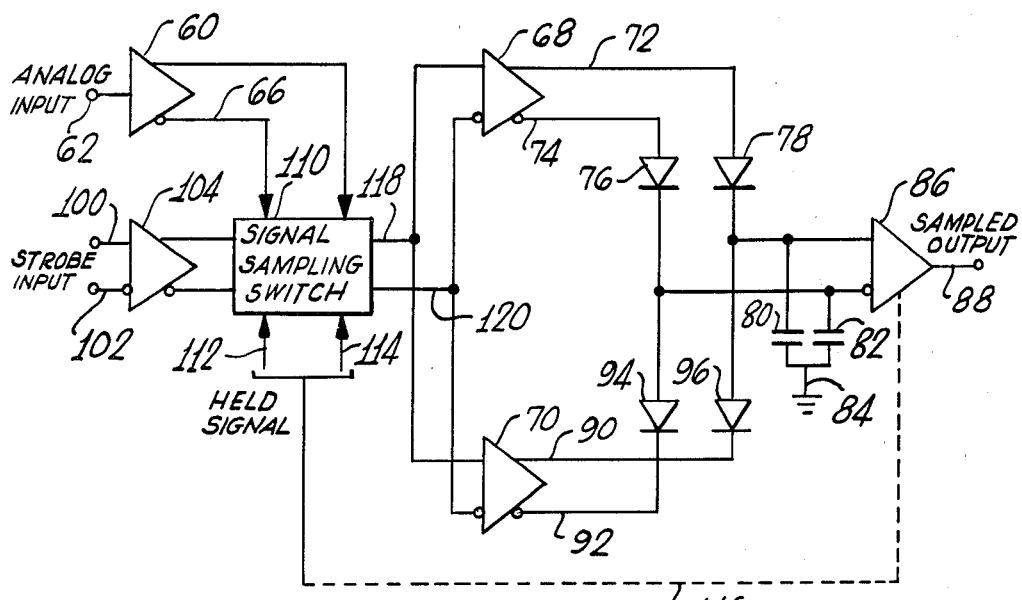
FIG. 5 is a simplified schematic diagram similar to FIG. 4, but having portions related to diode switching omitted for clarity, and showing how a held analog signal is substituted for a varying analog input signal during the hold mode.

The circuit shown in FIG. 5 is for the most part similar to that shown in FIG. 4, and identical numerals have been used to indicate corresponding components. For clarity, differential amplifier 106 has been omitted from FIG. 5, although it will be understood that switching signals will be derived from the strobe amplifier 104, and applied to the diodes 76, 78, 94 and 96, in the same manner as was described in relation to FIG. 4. FIG. 5 further illustrates a technique for practically eliminating errors due to capacitive coupling through the switch elements, i.e. through the diodes 76, 78, 94 and 96, when in the hold mode. Even though the diodes are reverse-biased in the hold mode, a signal may be capacitively coupled through one or more of the diodes and may affect the amount of charge on the capacitors 80 and 82, and thereby influence the value of the sample output. To minimize this effect, an analog signal switch 110 is employed to substitute, during the hold mode, a different signal for the analog input signal obtained on lines 64 and 66. The substituted signal, and therefore the overall reverse-bias on the diodes, is totally independent of the current analog input signal level, thereby eliminating a possible source of non-linearity in the sample-and-hold circuit, as well as reducing analog feedthrough during the transition from the tracking mode to the hold mode.

The switch 110 is basically a double-pole-double-throw switch controlled by strobe signals supplied by the output of amplifier 104. The analog input signals are provided to the signal sampling switch 110 on lines 64 and 66, and a corresponding pair of input lines 112 and 114 provide a differential signal representative of the signal held in the capacitors 80 and 82. This held signal is derived from the post-amplifier 86, as indicated by the broken line 116 from the amplifier 86 to the analog signal switch 110.

In the tracking mode, the analog signal switch 110 couples the analog input signals on lines 64 and 66 through to output lines 118 and 120, which are connected as inputs to the differential amplifiers 68 and 70, in the same manner that the signal lines 64 and 66 are connected to these amplifiers in the circuit of FIG. 4. In the hold mode, the signal sampling switch 110 substitutes the held signal on lines 112 and 114 for the analog signal on lines 64 and 66. Consequently, the held signal is switched through to the lines 118 and 120, is amplified by differential amplifier 68 and 70, and then may be capacitively coupled through the diodes 76, 78, 94 and 96, and thence to the capacitors 80 and 82. In this manner, the voltage held on the capacitors is maintained at an essentially constant level that is independent of variations in the analog input signal level during the hold mode. When the circuit is switched to the tracking mode again, the analog switch 110 selects the analog inputs on lines 64 and 66 from the preamplifier 60. Simultaneously, the diodes 76, 78, 94 and 96 are forward-biased, and the analog signals on lines 72, 74, 90 and 92 are coupled to the capacitors 80 and 82.

It will be appreciated that the simplified schematics discussed up to this point are not completely detailed representations of a preferred detailed embodiment of the invention. More complete schematic details are provided by way of example in the schematic of FIG. 7. The only elements omitted from FIG. 7, but contained in FIG. 5, are the pre-amplifier 60, the strobe input amplifier 104, and the post-amplifier 86. It will be seen from FIG. 7 that complementary analog inputs are provided from the pre-amplifier 60 on lines 64 and 66, and that lines 130 and 132 provide connection between the capacitors 80 and 82 and the post-amplifier 86 (not shown in FIG. 7). The signal on lines indicated as TRACK and $\overline{\text{TRACK}}$ are the mode determining signals provided from the strobe input amplifier 104 (FIG. 4). In addition, the signals on lines indicated at T1 and $\overline{\text{T1}}$ are also mode determining signals logically identical with TRACK and $\overline{\text{TRACK}}$, respectively, but providing a different dc level for operation of current switching transistors T33–T36.

The signals on lines indicated as HELD and $\overline{\text{HELD}}$ correspond with the held signal lines 112 and 114 in FIG. 5. It will be further apparent that, when the TRACK signal is in a high state, transistors T25, T30, T27 and T32 are rendered conductive, and are operative to supply current to transistors T13, T14, T15 and T16, to which the analog signals on lines 64 and 66 are applied. When the TRACK signal is in a low state, however, transistors T26, T29, T28 and T31 are rendered conductive, thus supplying current to transistors T21–T24, and selecting the HELD signals on lines 112 and 114, instead of the analog signals on lines 64 and 66, for coupling to the diodes 76, 78, 94 and 96 (FIG. 4), indicated as D5, D6, D7 and D8 in FIG. 7. It will be apparent that the transistors T25–T32 together comprise the signal sampling switch 110 of FIG. 5, effecting selection of an analog input signal during the tracking mode, and the held analog signal during the hold mode.

As previously mentioned, transistors T33–T36 are switched in pairs in response to the state of the signal T1, which is logically identical to the TRACK signal. In the tracking mode, signal T1 switches transistors T34 and T36 on, and this has the affect of drawing current through transistors T7 and T8, and drawing a forward-bias current through diodes D5 and D7, as well as through diodes D6 and D8. The diodes are, therefore, rendered conductive in the tracking mode, and the capacitors, shown as C1 and C2 in FIG. 7, are connected into the circuit to allow the analog signals to be coupled onto the capacitors.

When the circuit is switched to the hold mode, transistors T33 and T35 are switched on, and transistors T34 and T36 are simultaneously switched off. Current is then drawn through transistors T5 and T6, and through load resistors R1 and R2. Since resistors R1 and R2 are connected to the anode terminals of diodes D5 and D6, the voltages at these terminals are lowered, i.e. made more negative, in the hold mode, thereby reverse-biasing the diodes into non-conduction. Likewise, since current is not drawn through load resistors R3 and R4 in the hold mode, the voltage on the terminals of these resistors, which are connected to the cathode terminals of diodes D7 and D8, is raised near to ground level, thereby also tending to reverse-bias the diodes.

Figure 7:
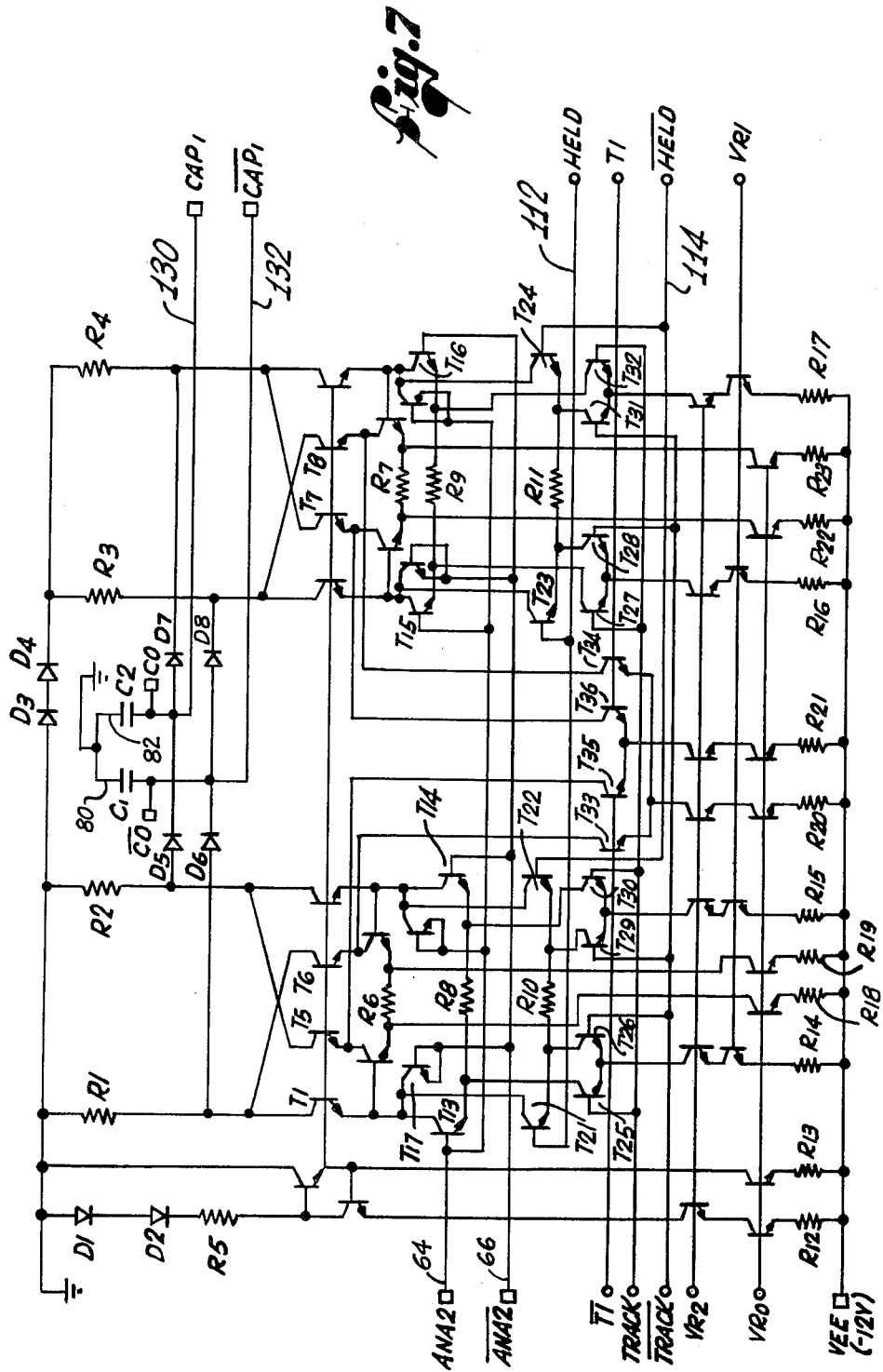
FIG. 7 is a detailed schematic diagram of a sampling circuit similar to that shown in simplified form in FIGS. 4 and 5.

It will be seen from FIG. 7 that the anodes of diodes D5 and D6 are connected to ground through resistors R2 and R1 respectively, and that the cathodes of diodes D7 and D8 are connected to resistors R4 and R3, respectively, the other terminals of R4 and R3 being connected together to the cathode side of two additional series-connected diodes D3 and D4, the anode side of these diodes being grounded. The diode pair D3 and D4 compensates for the voltage drop across both of the pairs D5–D7 and D6–D8, and maintains a constant forward-bias current in these diode pairs.

More specifically, when a constant current is drawn through transistor T8, for example, in the tracking mode, part of this current will be drawn through a current branch comprising diodes D6 and D8 and resistor R1, and part through a parallel current branch comprising resistor R3. If diodes D3 and D4 were not present, and if the voltage drop across diodes D6 and D8 were to change, in accordance with a temperature variation, the current ratio in these two current branches would also change, as would the current through diodes D6 and D8. However, diodes D3 and D4 provide a voltage drop identical with that across diodes D6 and D8, so that the current ratio between the branches will be always maintained substantially constant, as will the absolute value of forward-bias current. D3 and D4 serve an identical function for diodes D5 and D7. The power supply for the circuit is indicated at $V_{EE}$ in the lower left corner of FIG. 7 and the other connections for voltages $R_{R0}$, $V_{R1}$ and $V_{R2}$ supply reference voltages derived from a power supply circuit module (not shown), and used to generate constant current levels in the circuit.

Although it will be understood that many different detailed circuit designs are possible, the following circuit parameters are provided by way of example:
R1–R4=281 ohms
R5=3,440 ohms
R6–R7=476 ohms
R8–R11=550 ohms
R12–R13=1,200 ohms
R14–R17=240 ohms
R18, R19, R22, R23=720 ohms
R20–R21=134 ohms
C1, C2=1 pF.
The transistors and diode geometries are correspondingly scaled to handle the current levels and parameter match requirements for the circuit.

Figure 8:
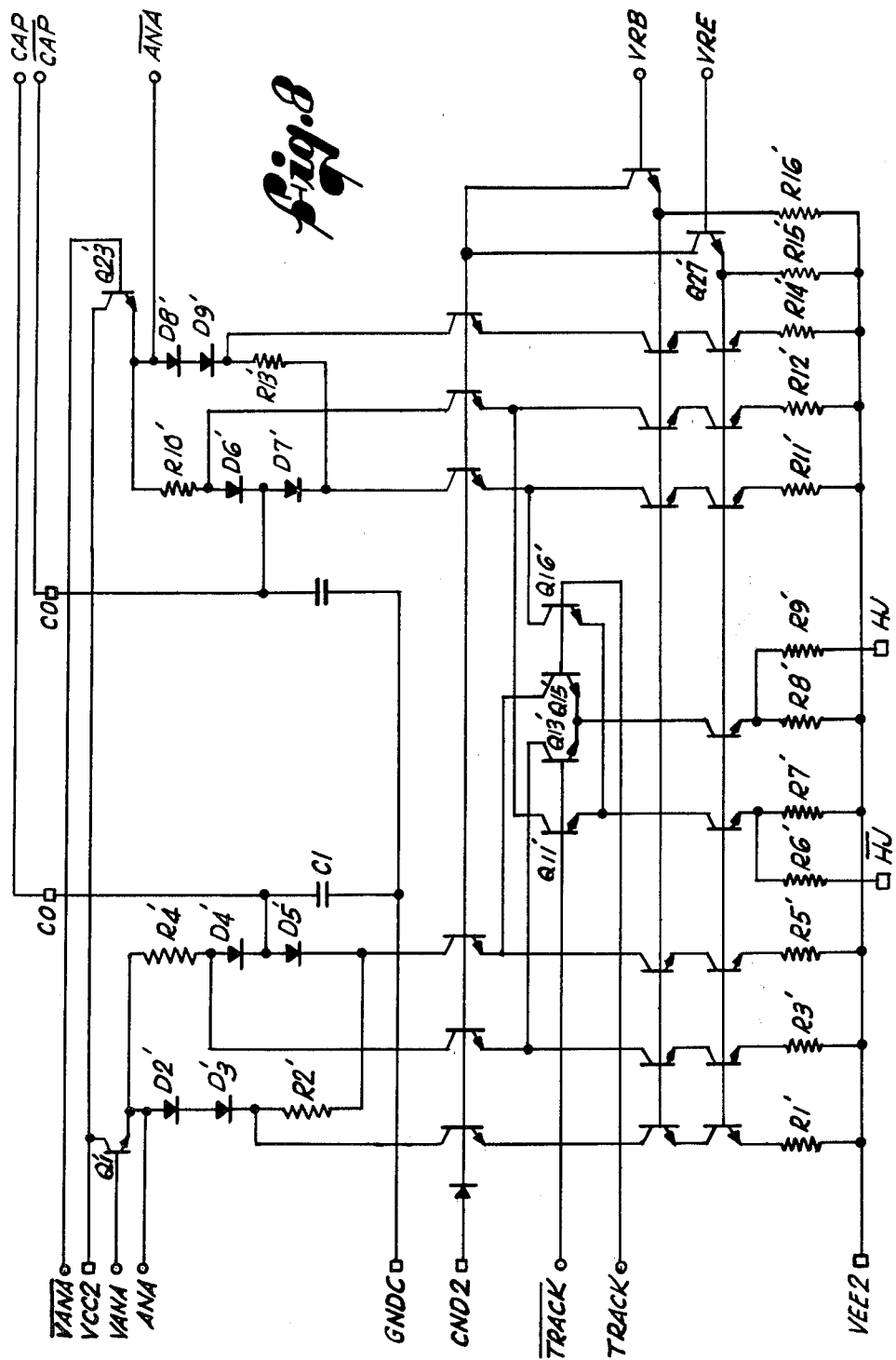
FIG. 8 is a detailed schematic diagram of a sampling circuit similar to FIG. 7, but employing voltage injection of the analog signal, rather than current modulation.

A significant variation of the sampling circuitry of FIG. 7 is shown in FIG. 8. Again there are two pairs of switching diodes D4', D5', and D6', D7', corresponding exactly to the diodes D5, D7, D6 and D8 in FIG. 7. In the FIG. 8 circuit, however, the anodes of diode D4' and D6' are not connected to ground through lead resistors but are connected to the emitter terminals of transistors Q1' and Q23', through resistors R4' and R10', respectively. The collectors of transistors Q1' and Q23' are both connected to a power supply line indicated as VCC2, and the base terminals are supplied with complementary analog input voltage signals to be sampled, indicated at VANA and $\overline{\text{VANA}}$.

Transistors Q11', Q13', Q15' and Q16' perform the same function as transistors T33–T36 in FIG. 7. i.e., they switch the switching diodes between tracking mode and hold mode in response to the TRACK signal. The analog input signal VANA is buffered by transistors Q1' and Q23', and impressed on the capacitors C1' and C2' through resistors R4' and R10' and diodes D4' and D6', and simultaneously also through diodes D2', D3', resistor R2' and diode D5', as well as through diodes D8', D9', resistor R13' and diode D7'. In contrast, the analog signal fed into the FIG. 7 circuitry (ANA2) is used to modulate a constant current through the switching diodes.

Diodes D2', D3', D8' and D9' perform the same function in the FIG. 8 circuitry as the diodes D1 and D2 perform in the FIG. 7 circuitry. In particular, diodes D2' and D3' are connected in series with resistor R2' and form a path parallel to that made up of diodes D4' and D5' and resistor R4'. The voltage drops along these parallel paths will be identical, so that the current ratio between them will be constant, as will the absolute value of forward-bias current through the switching diodes. Diodes D8' and D9' perform the same function with respect to switching diodes D6' and D7'.

Figure 6:
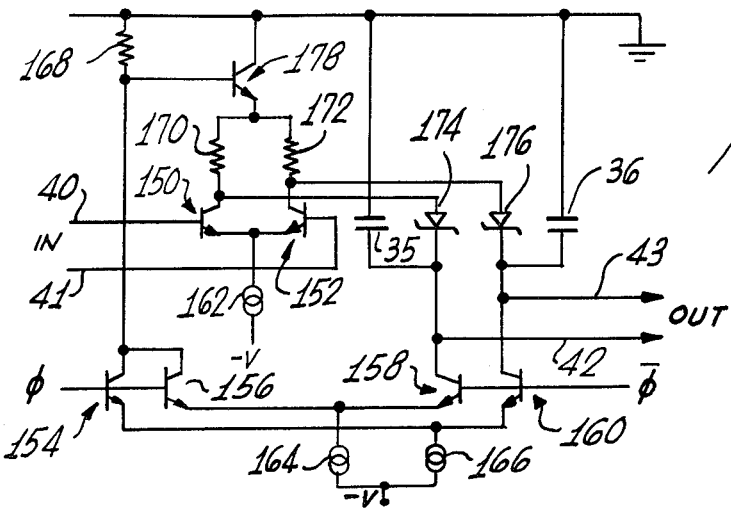
FIG. 6 is a schematic diagram of a switch that can be used in the simplified schematic diagram of FIG. 2 or FIG. 3.

The following resistance values are provided by way of example for the circuitry of FIG. 8:
R1', R3', R5', R11', R12', R14'=376.2 ohms
R2', R4', R10', R13'=330 ohms
R6', R9'=200 ohms
R7', R8'=200 ohms
R15'=1642 ohms
R16'=2714 ohms By way of further example, FIG. 6 shows an alternative design for a switching circuit that might be used in conjunction with the simplified diagram shown in FIG. 3. The circuit comprises three pairs of NPN transistors, indicated at 150 and 152, 154 and 160, and 156 and 158, and three constant current generators 162, 164, and 166. The circuit also includes three resistors 168, 170 and 172 and two Schottky diodes 174 and 176. An additional NPN transistor 178 has its collector terminal gounded and its emitter terminal connected to a common junction point between resistors 170 and 172. The other terminal of resistor 170 is connected to the collector of transistor 150, and the other terminal of resistor 172 is connected to the collector of transistor 152. The emitter terminals of the pair of transistors 150 and 152 are connected in common to constant current generator 162, and an analog input signal is supplied over lines 40 and 41 to the base terminals of transistors 150 and 152.

Resistor 168 has one terminal connected to ground and the other terminal connected to the base of transistor 178 and also to the collectors of transistors 154 and 156, the emitters of which are connected to constant current generators 166 and 164, respectively. Constant current generators 164 and 166 also draw current from the emitters of transistors 158 and 160, respectively. The collectors of transistors 150 and 152 are also connected to the anodes of the diodes 174 and 176, the cathodes of which are connected to output lines 42 and 43 and to the collectors of transistors 158 and 160. Capacitor 35 is connected between the cathode of diode 174 and ground, and capacitor 36 is connected between the cathode of diode 176 and ground.

A strobe signal is applied to the base terminals of transistors 154 and 156, and a complementary strobe signal is applied to the base terminals of transistors 158 and 160. When the strobe signal applied to transistors 154 and 156 is in a low state, these transistors are rendered non-conductive, and very little current is directed through resistor 168. At the same time, the transistors 158 and 160 are conductive, and the diodes 174 and 176 are forward-biased, allowing the analog signal impressed on the collector terminals of transistors 150 and 152 to be coupled through the diodes to the capacitors 35 and 46. In the hold mode, the polarity of the strobe signal applied to transistors 154 and 156 is reversed, and these transistors become conductive, while transistors 158 and 160 become non-conductive. A relatively large current in resistor 168 results, and the voltage at the emitter of transistor 178 is brought negative. Consequently, the diodes 174 and 176 are reverse-biased, isolating the capacitors 35 and 36 from the analog signal applied to the transistors 150 and 152.

It will be appreciated from the foregoing that the present invention represents a significant advance in the field of sample-and-hold circuits. In particular, it provides a differential monolithic sample-and-hold circuit with the low cost associated with integrated circuitry, but with high speed and accuracy previously obtainable only from more costly hybrid circuitry. It will also be apparent that, although specific embodiments of the invention have been described in detail for purposes of illustration, various modifications may be made without departing from the spirit and scope of the invention. Accordingly, the invention is not to be limited except as by the appended claims.

We claim:

1. A monolithic differential sample-and-hold circuit, comprising:
    a preamplifier for processing an analog input signal and providing corresponding differential analog signals;
    a first differential amplifier connected to receive the analog signals from said preamplifier to provide a first amplified differential analog signal;
    a second differential amplifier also connected to receive the analog signals from said preamplifier, to provide a second amplified differential analog signal identical to said first amplified differential analog signal;
    two capacitors, each having a grounded terminal and an ungrounded terminal;
    a first pair of diodes having anode terminals connected to receive said first amplified differential analog signal, and cathode terminals each connected to said ungrounded terminal of a different one of said capacitors;
    a second pair of diodes having cathode terminals connected to receive said second differential analog signal and anode terminals connected to corresponding cathode terminals of said first pair of diodes;
    a post-amplifier having differential inputs connected to said ungrounded terminals of said capacitors; and
    a bias signal source connectable to said first and second pairs of diodes to provide forward bias in response to a tracking-mode signal and reverse bias in response to a hold-mode signal;
    whereby said first and second pairs of diodes are forward-biased in response to the tracking-mode signal, to allow said first and second amplified differential analog signals to be coupled through said first and second pairs of diodes to said capacitors, and are reverse-biased in response to the hold-mode signal, to isolate said capacitors from said analog signals.

2. A monolithic differential sample-and-hold circuit as set forth in claim 1, and further including:
    means, also responsive to the hold-mode signal, for disconnecting the differential analog signals from said first and second differential amplifiers, and substituting a held analog signal derived from said capacitors, whereby the effects of any coupling through said diodes when in the hold mode are minimized by the substitution of a held signal independent of the analog input signals.

3. A monolithic differential sample-and-hold circuit as set forth in claim 1, wherein:
    said first and second amplified differential analog signals are current signals that are converted to voltage signals by resistors in the tracking mode, and are thereby coupled to said capacitors.

4. A monolithic differential sample-and-hold circuit comprising:
    a preamplifier for processing an analog input signal and providing corresponding differential analog signals;
    a first differential amplifier connected to receive the analog signals from said preamplifier to provide a first amplified differential analog signal;
    a second differential amplifier also connected to receive the analog signals from said preamplifier, to provide a second amplified differential analog signal identical to said first amplified differential analog signal;
    two capacitors, each having a grounded terminal and an ungrounded terminal;
    a first pair of diodes having anode terminals connected to receive said first amplified differential analog signal, and cathode terminals each connected to said ungrounded terminal of a different one of said capacitors;
    a second pair of diodes having cathode terminals connected to receive said second differential analog signal and anode terminals connected to corresponding cathode terminals of said first pair of diodes;
    a post-amplifier having differential inputs connected to said ungrounded terminals of said capacitors; and a bias signal source connectable to said first and second pairs of diodes to provide forward bias in response to a tracking-mode signal and reverse bias in response to a hold-mode signal; said bias signal source including means for maintaining a constant forward-bias current through said diodes when in the tracking mode, in spite of variations in diode characteristics due to temperature changes whereby said first and second pairs of diodes are forward-biased in response to the tracking-mode signal, to allow said first and second amplified differential analog signals to be coupled through said first and second pairs of diodes to said capacitors, and are reverse-biased in response to the hold-mode signal, to isolate said capacitors from said analog signals.

5. A monolithic differential sample-and-hold circuit as set forth in claim 4, wherein:
    said circuit further includes a first pair of load resistors providing a path to ground from the anodes of said first pair of diodes, and a second pair of load resistors providing a path to ground from the cathodes of said second pair of diodes;
    said means for maintaining a constant forward-bias current includes constant current generation means connectable in the tracking mode to draw a constant total current through said diodes and said second pair of resistors, and further includes an additional pair of diodes connected in series between ground and said second pair of load resistors, whereby said additional pair of diodes duplicates the impedance characteristics of each series-connected pair of said first and second pairs of diodes and thereby maintains a constant current ratio between the current in one series-connected pair of diodes and a corresponding one of said second pair of load resistors, and thereby also maintains a constant current through each series-connected pair of diodes.

6. A differential sample-and-hold circuit comprising:
    input amplifier means providing a differential analog signal;
    capacitor means;

switching means for selectively coupling the differential analog signal to said capacitor means; and output amplifier means having differential inputs supplied from said capacitor means, to provide a sampled analog output signal;

and wherein said capacitor means includes two capacitors, each connected between a common point and one of the differential inputs of said output amplifier means, said switching means includes two pairs of diodes, means for forward-biasing said diodes to provide a tracking mode of operation, in which the differential analog signal is coupled to said capacitors, and means for reverse-biasing said diodes to provide a hold mode of operation, in which said capacitors are electrically isolated from the differential analog signal and provide inputs representative of a sampled analog signal to said output amplifier means, and said input amplifier means includes a preamplifier providing a differential analog signal, and two differential amplifiers, each having inputs supplied by said preamplifier, and each supplying a differential pair of outputs to a different one of said pairs of diodes.

7. A differential sample-and-hold circuit, comprising:

input amplifier means providing a differential analog signal;

capacitor means;

switching means for selectively coupling the differential analog signal to said capacitor means; and output amplifier means having differential inputs supplied from said capacitor means, to provide a sampled analog output signal;

and wherein said capacitor means includes two capacitors, each connected between a common point and one of the differential inputs of said output amplifier means, said switching means includes at least one pair of diodes, means for forward-biasing said diodes to provide a tracking mode of operation, in which the differential analog signal is coupled to said capacitors, and means for reverse-biasing said diodes to provide a hold mode of operation, in which said capacitors are electrically isolated from the differential analog signal and provide inputs representative of a sampled analog signal to said output amplifier means, and said switching means further includes means operative only in the hold mode, for disconnecting the differential analog signal and substituting a signal derived from said capacitors, to minimize the effect of coupling through said diodes when in the hold mode, the substituted signal being independent of the differential analog signal.

8. A differential sample-and-hold circuit, comprising:

input amplifier means providing a differential analog signal;

capacitor means;

switching means for selectively coupling the differential analog signal to said capacitor means; and output amplifier means having differential inputs supplied from said capacitor means, to provide a sampled analog output signal;

and wherein said capacitor means includes two capacitors, each connected between a common point and one of the differential inputs of said output amplifier means, and said switching means includes at least one pair of diodes, means for compensating for changes in conduction characteristics of said diodes due to temperature, means for forward-biasing said diodes to provide a tracking mode of operation, in which the differential analog signal is coupled to said capacitors, and means for reverse-biasing said diodes to provide a hold mode of operation, in which said capacitors are electrically isolated from the differential analog signal and provide inputs representative of a sampled analog signal to said output amplifier means.

* * * * *

UNITED STATES PATENT AND TRADEMARK OFFICE
CERTIFICATE OF CORRECTION

PATENT NO. : 4,370,572

DATED : January 25, 1983

INVENTOR(S) : Albert E. Cosand et al.

It is certified that error appears in the above-identified patent and that said Letters Patent are hereby corrected as shown below:

Column 4, line 64 "dioes" should be deleted and --diodes-- substituted therefor.

Column 7, line 16 "$R_{RO}$" should be deleted and --$V_{RO}$-- substituted therefor.

Column 7, line 40 "lead" should be deleted and --load-- substituted therefor.

Column 8, line 9 "200 ohms" should be deleted and --94 ohms-- substituted therefor.

Column 8, line 20 "gounded" should be deleted and --grounded-- substituted therefor.

Signed and Sealed this

Thirteenth Day of December 1983

[SEAL]

Attest:

GERALD J. MOSSINGHOFF

Attesting Officer

Commissioner of Patents and Trademarks